United States Patent
Tsuzuki

(10) Patent No.: US 9,281,800 B2
(45) Date of Patent: Mar. 8, 2016

(54) RESONATOR FILTER DEVICE HAVING NARROW PASS-BAND

(71) Applicant: Avago Technologies General IP (Singapore) Pte. Ltd., Singapore (SG)

(72) Inventor: Genichi Tsuzuki, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 120 days.

(21) Appl. No.: 14/163,293

(22) Filed: Jan. 24, 2014

(65) Prior Publication Data

US 2015/0214923 A1    Jul. 30, 2015

(51) Int. Cl.
| | | |
|---|---|---|
| *H01Q 1/50* | (2006.01) | |
| *H03H 9/46* | (2006.01) | |
| *H03H 9/64* | (2006.01) | |
| *H03H 9/54* | (2006.01) | |

(52) U.S. Cl.
CPC ............... *H03H 9/46* (2013.01); *H03H 9/547* (2013.01); *H03H 9/64* (2013.01)

(58) Field of Classification Search
CPC ....... H03H 9/64; H03H 9/547; H03H 9/6409; H03H 2003/021; H03H 2003/0414; H03H 9/46; H01Q 1/50
USPC .................... 343/833, 850; 333/189, 187, 133
See application file for complete search history.

(56) References Cited

U.S. PATENT DOCUMENTS

| | | | |
|---|---|---|---|
| 5,854,579 A | 12/1998 | Penunuri | |
| 5,910,756 A * | 6/1999 | Ella | 333/133 |
| 6,081,171 A * | 6/2000 | Ella | 333/189 |
| 6,885,262 B2 | 4/2005 | Nishimura et al. | |
| 8,183,958 B2 | 5/2012 | Fujita | |
| 8,751,993 B1 * | 6/2014 | Fenzi et al. | 716/122 |
| 2004/0130411 A1 * | 7/2004 | Beaudin et al. | 333/133 |
| 2006/0055486 A1 * | 3/2006 | Nakatsuka et al. | 333/133 |
| 2008/0007369 A1 * | 1/2008 | Barber et al. | 333/189 |
| 2008/0055020 A1 * | 3/2008 | Handtmann et al. | 333/189 |
| 2008/0100397 A1 * | 5/2008 | Nam et al. | 333/133 |
| 2010/0073106 A1 * | 3/2010 | Stuebing et al. | 333/187 |
| 2012/0235877 A1 * | 9/2012 | Beaudin et al. | 343/853 |
| 2013/0278356 A1 | 10/2013 | Meltaus et al. | |

FOREIGN PATENT DOCUMENTS

DE    101008045346 A1    3/2010

* cited by examiner

*Primary Examiner* — Jean B Jeanglaude

(57) ABSTRACT

A filter device for filtering signals via a pass-band includes series resonators connected in series between an input terminal and an output terminal, each of the series resonators having a corresponding parallel resonance frequency Fp and series resonance frequency Fs, and shunt resonators respectively connected between at least one of the series resonators and a ground voltage, each of the shunt resonators having a corresponding parallel resonance frequency Fp and series resonance frequency Fs. At least one series resonator has a corresponding series resonance frequency Fs outside the pass-band of the filter device, and at least one other series resonator has a corresponding series resonance frequency Fs inside the pass-band, and/or at least one shunt resonator has a corresponding parallel resonance frequency Fp outside the pass-band of the filter device, and at least one other shunt resonator has a corresponding parallel resonance frequency Fp inside the pass-band.

18 Claims, 18 Drawing Sheets

Series resonators

Shunt resonators

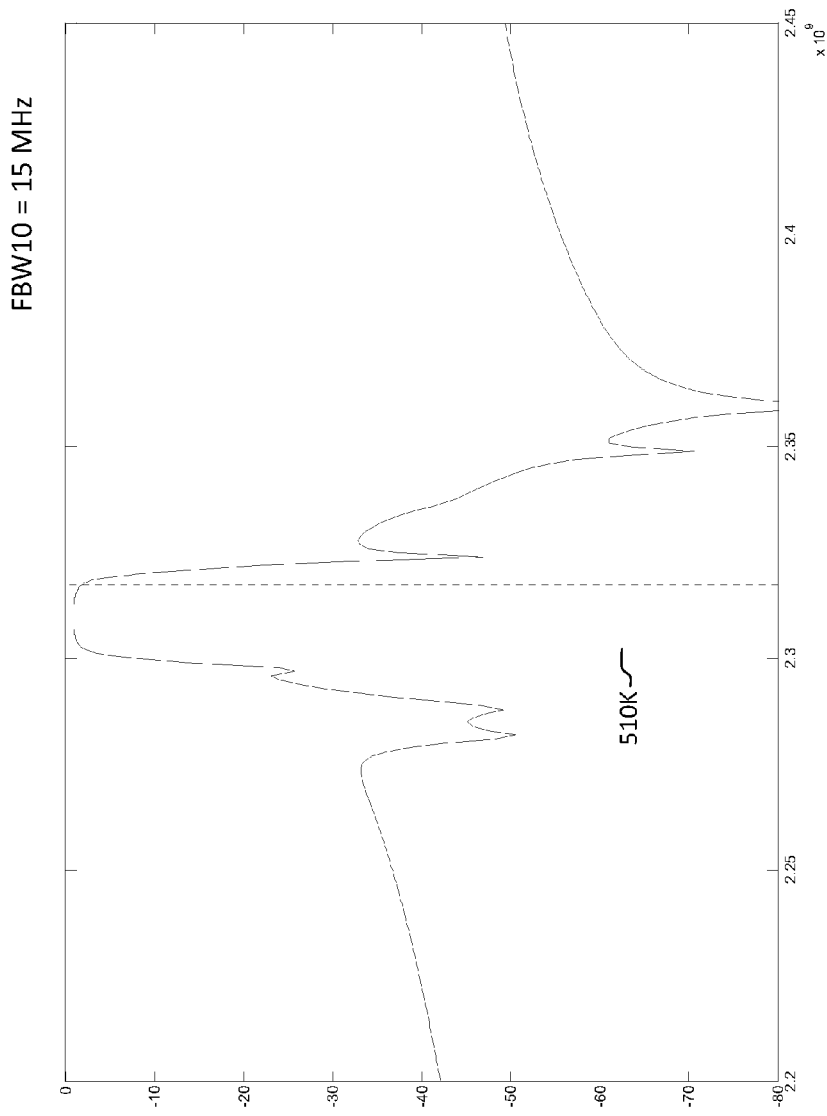

RESONATOR FILTER DEVICE HAVING NARROW PASS-BAND

BACKGROUND

Conventional acoustic resonator filters, such as ladder filters, are formed of series resonators connected in series between an input terminal and an output terminal, and shunt resonators respectively connected between at least one of the series resistors and a ground voltage. Each of the series resonators and the shunt resonators may be a bulk acoustic wave (BAW) resonator, such as a thin film bulk acoustic resonator (FBAR) or a solidly mounted resonator (SMR), or a surface acoustic wave (SAW) resonator, having a corresponding parallel resonance frequency Fp and series resonance frequency Fs.

Acoustic resonator filters may be used for various applications, particularly for portable communication devices, such as cellular telephones, personal digital assistants (PDAs), electronic gaming devices, laptop computers and the like, configured to communicate over wireless networks. When a portable communication device includes a transmitter and receiver (or transceiver), typically connected to a common antenna, for sending and receiving data and control signals over the wireless network, acoustic resonator filters may be incorporated in a duplexer for filtering both transmit and receive signals, respectively, at different frequencies and filter bandwidths.

However, filter bandwidth ranges of acoustic resonator filters are generally restricted by various factors, such as limited ranges of electromechanical coupling coefficients $Kt^2$, limited material quality factor (Q-factor), and fabrication process limitations (e.g., electrostatic discharge (ESD) issues). Accordingly, there is a need for acoustic filter bandwidths with improved filter characteristics, such as higher coupling coefficients $Kt^2$, and/or narrower acoustic filter bandwidths while maintaining current filter characteristics.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 5A to 5K are signal diagrams showing S-parameter S21 responses as functions of signal frequency in a step-by-step design process for narrowing a pass-band of a filter device, according to a representative embodiment.

DETAILED DESCRIPTION

Figure 1:
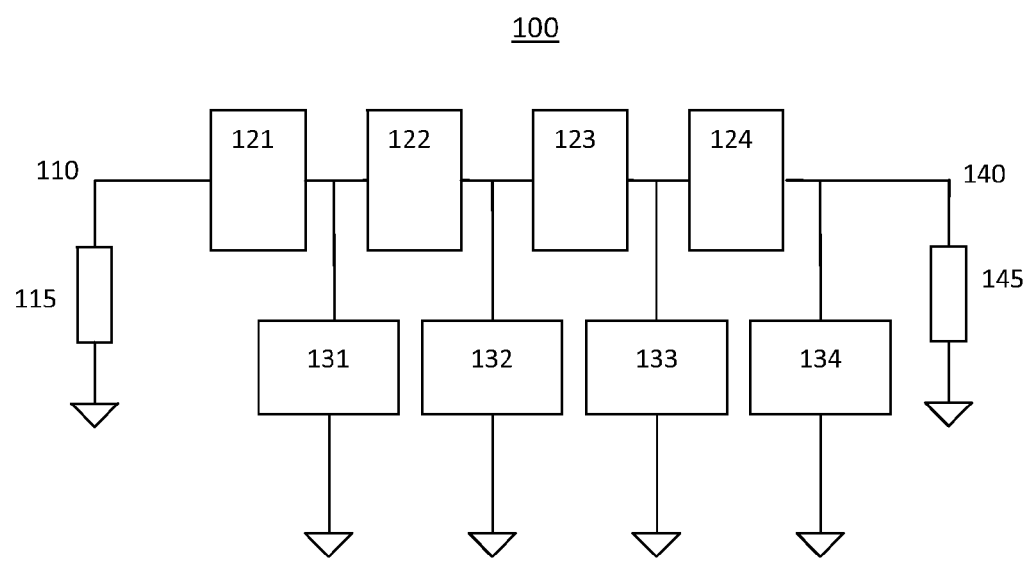
FIG. 1 is a block diagram illustrating a filter device with acoustic resonators, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

According to various embodiments, an acoustic filter device is able to realize a narrower filter bandwidth, while maintaining electromechanical coupling coefficient $Kt^2$, and/or to realize a higher electromechanical coupling coefficient $Kt^2$, while maintaining the filter bandwidth, e.g., two to three times higher than a corresponding conventional acoustic filter. For example, in a conventional ladder acoustic filter, all of the acoustic resonators in the acoustic filter (e.g., series and shunt resonators) are involved to create and maximize the filter bandwidth. In comparison, according to various embodiments, some acoustic resonators of the filter device are used to create the pass-band, while other acoustic resonators of the filter device are used to cut the pass-band (increasing the stop-band or reject-band).

For example, a conventional acoustic filter having a filter bandwidth (pass-band) of 15 MHz at about 2.3 GHz requires an electromechanical coupling coefficient $Kt^2$ of about 1.5 percent. In this case, the filter insertion loss is degraded because of poor quality factor (Q-factor) of the acoustic resonator. In comparison, an acoustic filter according to various embodiments having the same 15 MHz bandwidth is able to incorporate an electromechanical coupling coefficient $Kt^2$ of about 3.0 percent or more. A much higher Q-factor is therefore maintained, resulting in improved filter insertion loss.

In a representative embodiment, a filter device for filtering signals via a pass-band includes a plurality of series resonators connected in series between an input terminal and an output terminal, and a plurality of shunt resonators respectively connected between at least one of the series resonators and a ground voltage. Each of the series resonators has a corresponding parallel resonance frequency Fp and series resonance frequency Fs, and each of the shunt resonators has a corresponding parallel resonance frequency Fp and series resonance frequency Fs. At least one of the series resonators has a corresponding series resonance frequency Fs outside the pass-band of the filter device, and at least one other of the series resonators has a corresponding series resonance frequency Fs inside the pass-band, and/or at least one of the shunt resonators has a corresponding parallel resonance frequency Fp outside the pass-band of the filter device, and at least one other of the shunt resonators has a corresponding parallel resonance frequency Fp inside the pass-band.

In another representative embodiment, a filter device for filtering signals via a pass-band includes a plurality of series resonators on a chip connected in series between an input terminal and an output terminal, and a plurality of shunt resonators on the same chip respectively connected between at least one of the series resistors and a ground voltage. At least one series resonator contributes to band stop filtering, and at least one series resonator contributes to band pass filtering of the filter device. At least one shunt resonator contributes to band stop filtering, and at least one shunt resonator contributes to band pass filtering of the filter device.

In another representative embodiment, a filter device for filtering signals includes a plurality of series resonators connected in series between an input terminal and an output terminal, and a plurality of shunt resonators respectively connected between at least one of the series resistors and a ground voltage. The series resonators have corresponding different series resonance frequencies Fs, where the series resonators are arranged so that at least one of the different series resonance frequencies Fs occurs outside a pass-band of the filter device. The shunt resonators have corresponding different parallel resonance frequencies Fp, where the shunt resonators are arranged so that at least one of the different parallel resonance frequencies Fp occurs outside the pass-band of the filter device.

FIG. 1 is a block diagram illustrating a filter device with acoustic resonators, according to a representative embodiment.

Referring to FIG. 1, filter device 100 includes multiple series resonators, indicated by representative first series resonator 121, second series resonator 122, third series resonator 123 and fourth first series resonator 124, connected in series between an input terminal 110 (with impedance 115) and an output terminal 140 (with impendence 145). Each of the first through fourth series resonators 121-124 has a corresponding resonance frequency, including parallel resonance frequency Fp and series resonance frequency Fs. Generally, the parallel resonance frequencies Fp of the first through fourth series resonators 121-124 create transmission-zeros on a high frequency side of the pass-band.

The first through fourth series resonators 121-124 may be bulk acoustic wave (BAW) resonators, such as thin film bulk acoustic resonators (FBARs) or solidly mounted resonators (SMRs), or surface acoustic wave (SAW) resonators, for example. Each BAW resonator may include a thin film piezoelectric layer formed in a stacked structure between top and bottom electrodes. The piezoelectric layer may be formed of a material such as aluminum nitride (AlN), lead zirconate titanate (PZT), or the like. In an embodiment, the BAW resonators may be fabricated using a common layer of piezoelectric material. The top and bottom electrodes may be formed of any compatible conductive metal, such as molybdenum, tungsten, aluminum, or the like.

The filter device 100 further includes multiple shunt resonators, indicated by representative first shunt resonator 131, second shunt resonator 132, third shunt resonator 133 and fourth shunt resonator 134, connected between at least one of the first through fourth series resistors 121-124 and ground voltage. For example, in the depicted illustrative configuration, the first shunt resonator 131 is connected between a node connecting the first and second series resonators 121 and 122 and the ground voltage; the second shunt resonator 132 is connected between a node connecting the second and third series resonators 122 and 123 and the ground voltage; the third shunt resonator 133 is connected between a node connecting the third and fourth series resonators 123 and 124 and the ground voltage; and the fourth shunt resonator 134 is connected between a node connecting the fourth series resonators 124 and output terminal 140 and the ground voltage. Each of the first through fourth shunt resonators 131-134 has a corresponding resonance frequency, including parallel resonance frequency Fp and series resonance frequency Fs. The first through fourth shunt resonators 131-134 likewise may be BAW or SAW resonators, for example. Generally, the series resonance frequencies Fs of the first through fourth shunt resonators 131-134 create transmission-zeros on a low frequency side of the pass-band.

In various embodiments, the input terminal 110 may be connected to an antenna (not shown) and the output terminal 140 may be connected to a receiver (not shown), in which case the filter device 100 is configured as a receive filter for band pass filtering downlink wireless communication signals received through the antenna, for example. Alternatively, the input terminal 110 may be connected to a transmitter (not shown) and the output terminal 140 may be connected to an antenna, such that the filter device 100 is configured as a transmit filter for band pass filtering uplink wireless communication signals sent from the transmitter. The wireless communication signals may be radio frequency (RF) signals, for example, complying with various communication standards. Also, in various embodiments, the filter device 100 may be included in a duplexer having an antenna and a transceiver, where one filter device 100 is configured as a receive filter and another filter device 100 is configured as a transmit filter, as described above. Such a duplexer may be incorporated into any type of portable communication device, such as a cellular telephone, PDA, electronic gaming device, laptop computer and the like.

In general, BAW and SAW resonators are electromechanical (E-M) coupling resonators, which have three independent design parameters: impedance (Zs) of a static capacitor, series resonance frequency Fs and parallel resonance frequency Fp caused by the electromechanical coupling. As a practical matter, the parallel resonance frequency Fp becomes dependent on the series resonance frequency Fs because all electromechanical coupling resonators in a filter (fabricated on the same wafer), such as filter device 100, share substantially the same electromechanical coupling coefficient $Kt^2$, as provided by Equation (1):

$$Kt^2 \approx 4.8*(Fp-Fs)/(Fp+Fs) \qquad (1)$$

The series resonance frequency Fs may be defined as an independent parameter, in which case the parallel resonance frequency Fp becomes dependent on the series resonance frequency Fs. Therefore, only the impedance Zs and the series resonance frequency Fs out of the three design parameters may be available for designing each electromechanical resonator. That is, the impedance Zs and the series resonance frequency Fs of every electromechanical coupling resonator (e.g., first through fourth series resonators 121-124 and first through fourth shunt resonators 131-134) that forms the filter device 100 may be adjusted, along with other passive components, such as capacitors and/or inductors (not shown), included in the filter device 100, so that the filter device 100 has a desired bandwidth and rejection shape. In alternative embodiments, the parallel resonance frequency Fp may be defined as the independent parameter, without departing from the scope of the present teachings.

According to various embodiments, at least one of the first through fourth series resonators 121-124 has a corresponding series resonance frequency Fs outside the pass-band of the filter device 100, and at least one other of the first through fourth series resonators 121-124 has a corresponding series resonance frequency Fs inside the pass-band of the filter device 100. Also, at least one of the first through fourth shunt resonators 131-134 has a corresponding parallel resonance frequency Fp outside the pass-band of the filter device 100, and at least one other of the first through fourth shunt resonators 131-134 has a corresponding parallel resonance frequency Fp inside the pass-band of the filter device 100.

Generally, any of the first through fourth series resonators 121-124 having corresponding series resonance frequencies Fs inside the pass-band contributes to band pass filtering similarly to conventional band pass filters, and any of the first through fourth series resonators 121-124 having corresponding series resonance frequencies Fs outside the pass-band could contribute to band stop filtering function. Likewise, any of the first through fourth shunt resonators 131-134 having corresponding parallel resonance frequencies Fp inside the pass-band contributes to band pass filtering similarly to conventional band pass filters, and any of the first through fourth shunt resonators 131-134 having corresponding parallel resonance frequencies Fp outside the pass-band could contribute to band stop filtering function. Also, generally, all of the series resonators (e.g., series resonators 121-124) and all of the shunt resonators (e.g., shunt resonators 131-134) in a filter device (e.g., the filter device 100) work collectively, creating poles and zeros of the signal transfer function of the filter device, where the poles correspond to the pass-band and the zeros correspond to the reject-band of the filter device. Therefore, one cannot strictly define that only the series resonators having series resonance frequencies Fs outside of the pass-band and only the shunt resonators having parallel resonance frequencies Fp outside of the pass-band in a filter device contribute to the band stop filtering function. The other series and shunt resonators in the filter device also contribute to cut off the filter bandwidth effectively. However, the series resonators having series resonance frequencies Fs outside of the pass-band and the shunt resonators having parallel resonance frequencies Fp outside of the pass-band play dominant roles to reduce filter bandwidth.

Accordingly, the pass-band of the filter device 100 may be narrowed, while maintaining a relatively high electromechanical coupling coefficient $Kt^2$ (e.g., corresponding to a much wider pass-band in a conventional filter device). For example, according to various embodiments, the pass-band of the filter device 100 may have a narrow bandwidth determined approximately by the product of 0.4 and the difference between the parallel resonance frequency Fp and the series resonance frequency Fs (i.e., 0.4*(Fp−Fs)) of resonators of the filter device 100 (assuming for purposes of illustration that differences between all of the parallel and series resonators (Fp−Fs) are the same, although the parallel resonance frequencies Fp and the series resonance frequencies Fs themselves are different, and that the resolution bandwidths (RBWs) are the same).

Figure 2A:
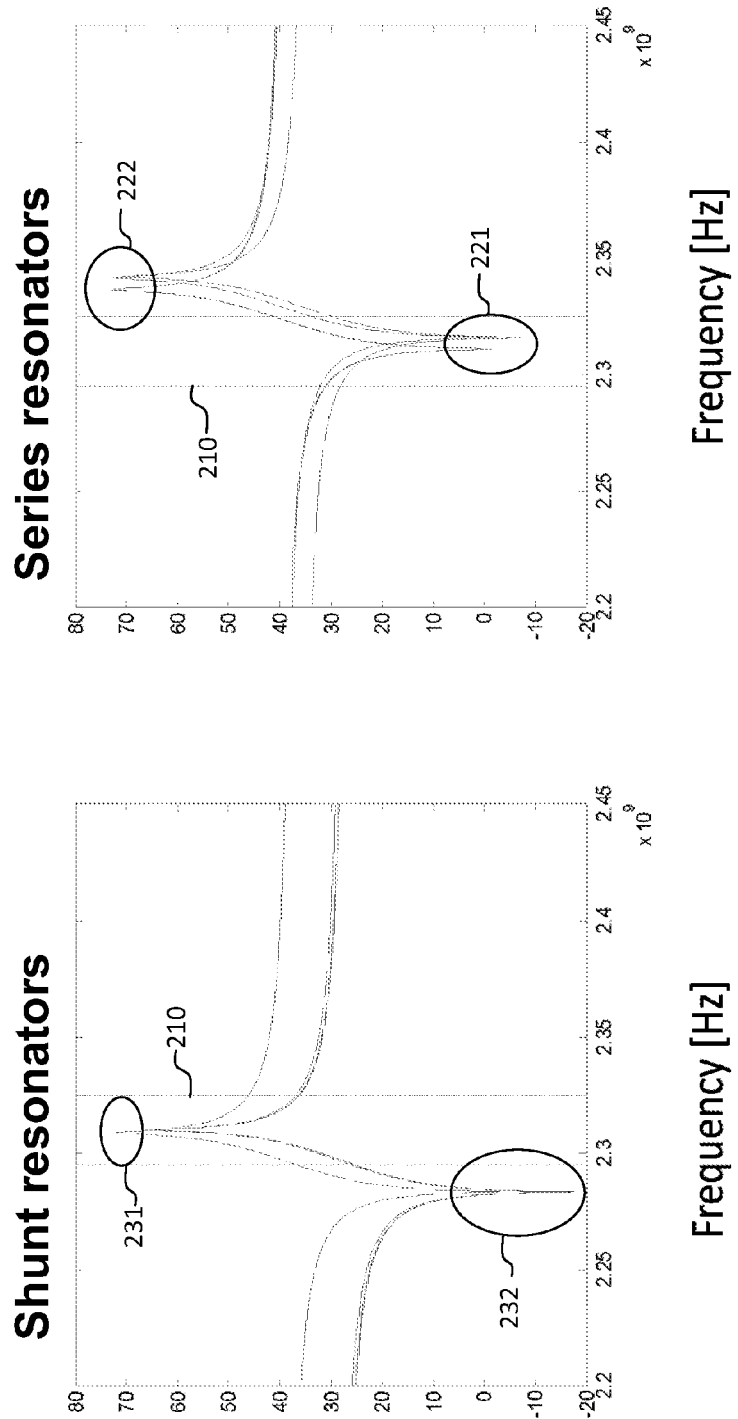
FIG. 2A is a signal diagram showing impedances of series and shunt resonators as a function of signal frequency in a conventional filter.
Figure 2B:
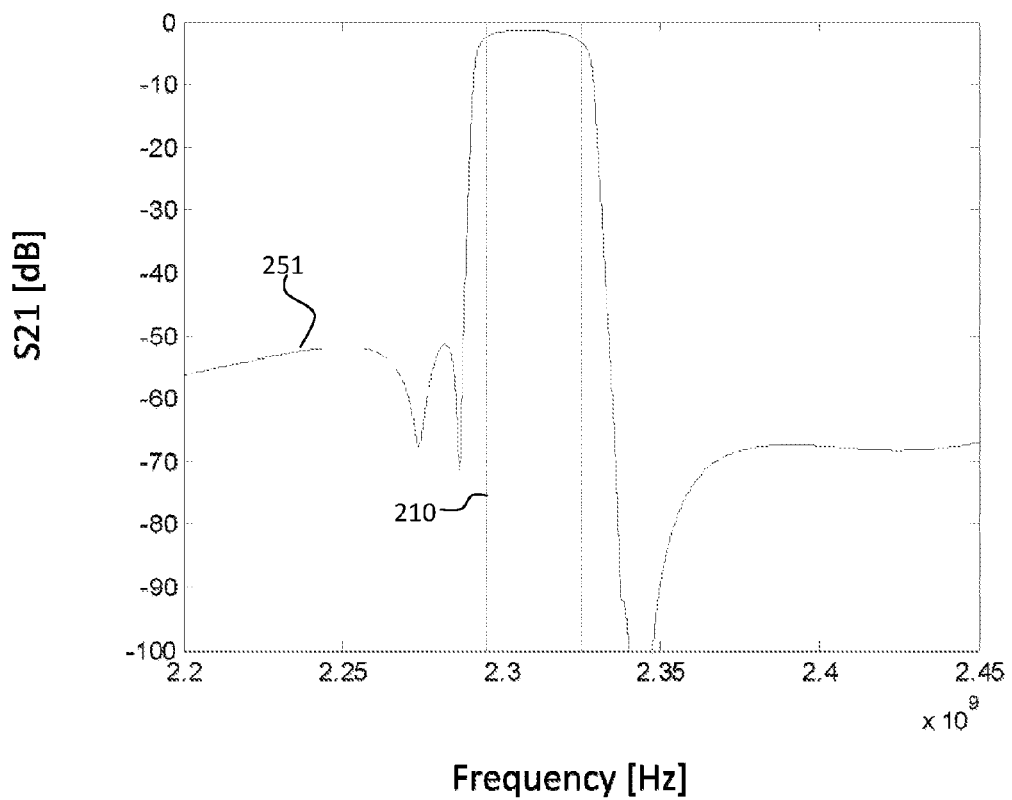
FIG. 2B is a signal diagram showing S-parameter S21 response as a function of signal frequency in a conventional filter.

FIGS. 2A and 2B are signal diagrams showing parameters of electromechanical coupling resonators in a conventional filter device. In particular, FIG. 2A shows impedance Z of the series and shunt resonators as a function of signal frequency, and FIG. 2B shows S-responses of the filter device as a function of signal frequency. As shown in FIGS. 2A and 2B, the conventional filter device has a representative pass-band 210 of about 30 MHz (from about 2295 MHz to about 2325 MHz), and each of the series and shunt resonators have an electromechanical coupling coefficient $Kt^2$ of about 3.0 percent, for purposes of illustration.

Referring to FIG. 2A, each of the electromechanical series resonators would be designed to have a series resonance frequency Fs inside the pass-band 210 (indicated by oval 221) and a parallel resonance frequency Fp outside the pass-band 210 (indicated by oval 222). That is, the relatively low impedances Z at the series resonance frequencies Fs enable signals to pass through the filter device within the pass-band 210, while the relatively high impedances Z at the parallel resonance frequencies Fp effectively block the signals from passing through the filter device outside the pass-band, thereby cutting off the high frequency side of the pass-band 210 (in the upper stop-band). Meanwhile, each of the electromechanical shunt resistors would be designed to have a parallel resonance frequency Fp inside the pass-band 210 (indicated by oval 231) and a series resonance frequency Fs outside the pass-band 210 (indicated by oval 232). That is, the relatively high impedances Z at the parallel resonance frequencies Fp prevent signals from going to ground and thus pass through the filter device within the pass-band 210, while the relatively low impedances Z at the series resonance frequencies Fs effectively ground the signals thus preventing them from passing through the filter device outside the pass-band, thereby cutting off the low frequency side of the pass-band 210 (in the lower stop-band).

Referring to FIG. 2B, trace 251 show S-parameter S21 (insertion loss) of the conventional filter device. The pass-band 210 (dotted line) corresponds to the pass-band 210 in FIG. 2A. The filter insertion loss is maintained lower and outside the pass-band 210 where the signal is rejected to transmit through the filter device.

Figure 3A:
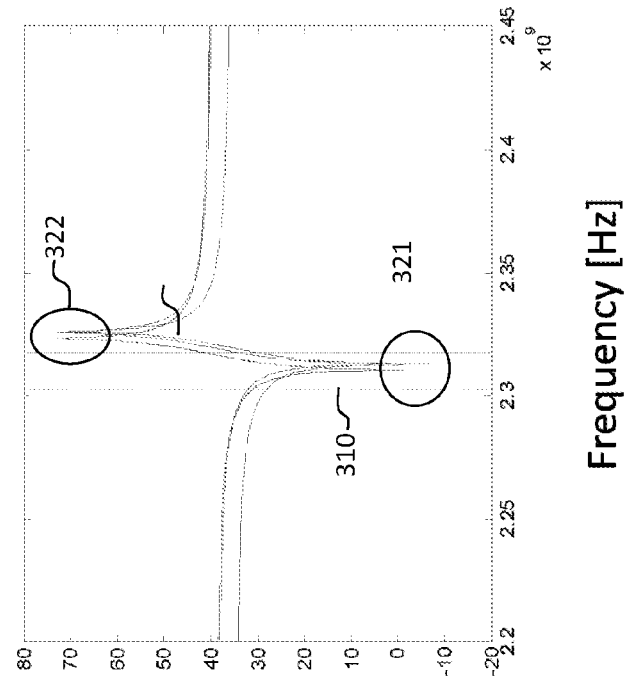
FIG. 3A is a signal diagram showing impedances of series and shunt resonators as a function of signal frequency in a conventional filter with a narrower filter bandwidth than shown in FIGS. 2A and 2B.
Figure 3A:
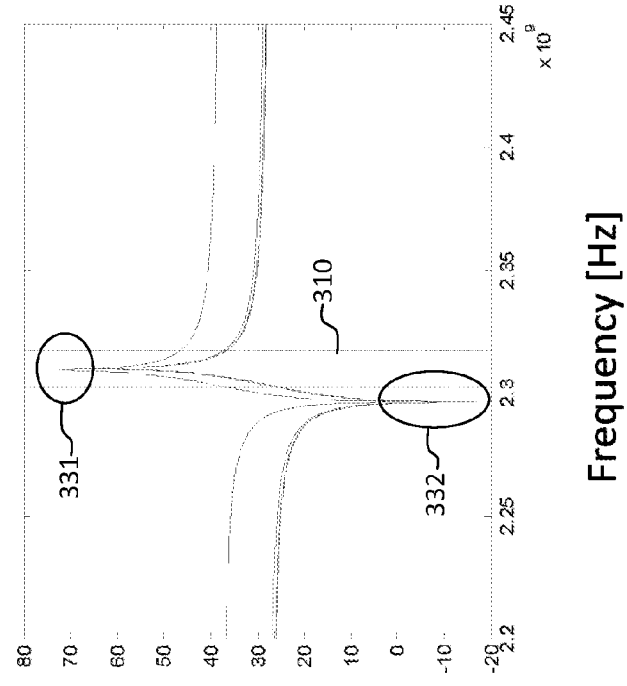
Figure 3B:
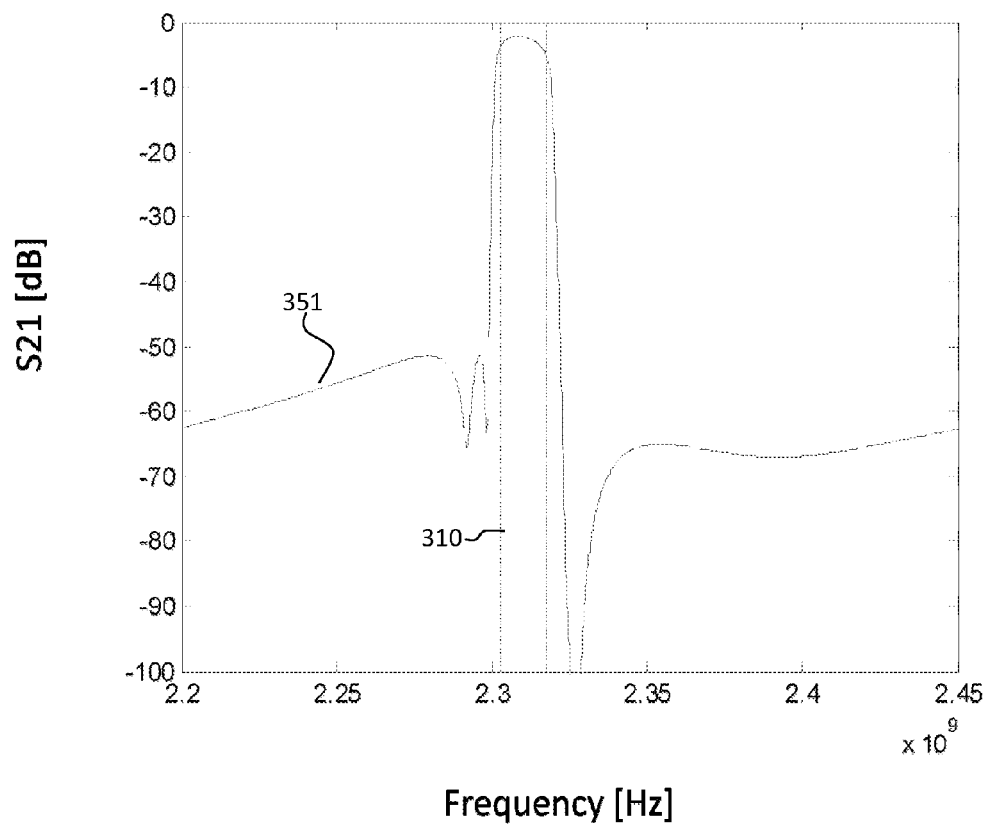
FIG. 3B is a signal diagram showing S-parameter S21 response as a function of signal frequency in a conventional filter with the narrower filter bandwidth than shown in FIGS. 2A and 2B.

FIGS. 3A and 3B are signal diagrams showing parameters of electromechanical coupling resonators in a conventional filter device when a filter bandwidth narrower than the filter bandwidth indicated by FIGS. 2A and 2B is required. In particular, FIG. 3A shows impedance Z of the series and shunt resonators as a function of signal frequency, and FIG. 3B shows the S-parameter S21 response of the filter device as a function of signal frequency. As shown in FIGS. 3A and 3B, the conventional filter device has a representative pass-band 310 of about 15 MHz (from about 2302.5 MHz to about 2317.5 MHz), and each of the series and shunt resonators has an electromechanical coupling coefficient $Kt^2$ of about 1.5 percent, for purposes of illustration. This approach provides a narrower filter bandwidth using conventional techniques. However, as described in the above, the resulting filter performance is degraded and/or undesirable process issues may arise.

Referring to FIG. 3A, each of the electromechanical series resonators would be designed to have a series resonance frequency Fs inside the narrower pass-band 310 (indicated by oval 321) and a parallel resonance frequency Fp outside the pass-band 310 (indicated by oval 322). Meanwhile, each of the electromechanical shunt resistors would be designed to have a parallel resonance frequency Fp inside the narrower pass-band 310 (indicated by oval 331) and a series resonance frequency Fs outside the pass-band 310 (indicated by oval 332). Referring to FIG. 3B, trace 351 shows S-parameter S21 of the conventional filter device. The pass-band 310 (dotted line) corresponds to the pass-band 310 in FIG. 3A. The filter insertion loss is maintained lower and outside the pass-band 310 where the signal is rejected to transmit through the filter device.

In contrast to such conventional filter devices, according to various embodiments, at least one of the first through fourth series resonators 121-124 shown in FIG. 1 is configured to have a corresponding series resonance frequency Fs outside the pass-band of the filter device 100, and at least one other of the first through fourth series resonators 121-124 is configured to have a corresponding series resonance frequency Fs inside the pass-band of the filter device 100. Similarly, at least one of the first through fourth shunt resonators 131-134 is configured to have a corresponding parallel resonance frequency Fp outside the pass-band of the filter device 100, and at least one other of the first through fourth shunt resonators 131-134 is configured to have a corresponding parallel resonance frequency Fp inside the pass-band of the filter device 100. Generally, the parallel resonance frequencies of the first through fourth series resonators 121-124 and the series resonance frequencies Fs of the first through fourth shunt resonators 131-134 remain outside the pass-band.

Figure 4A:
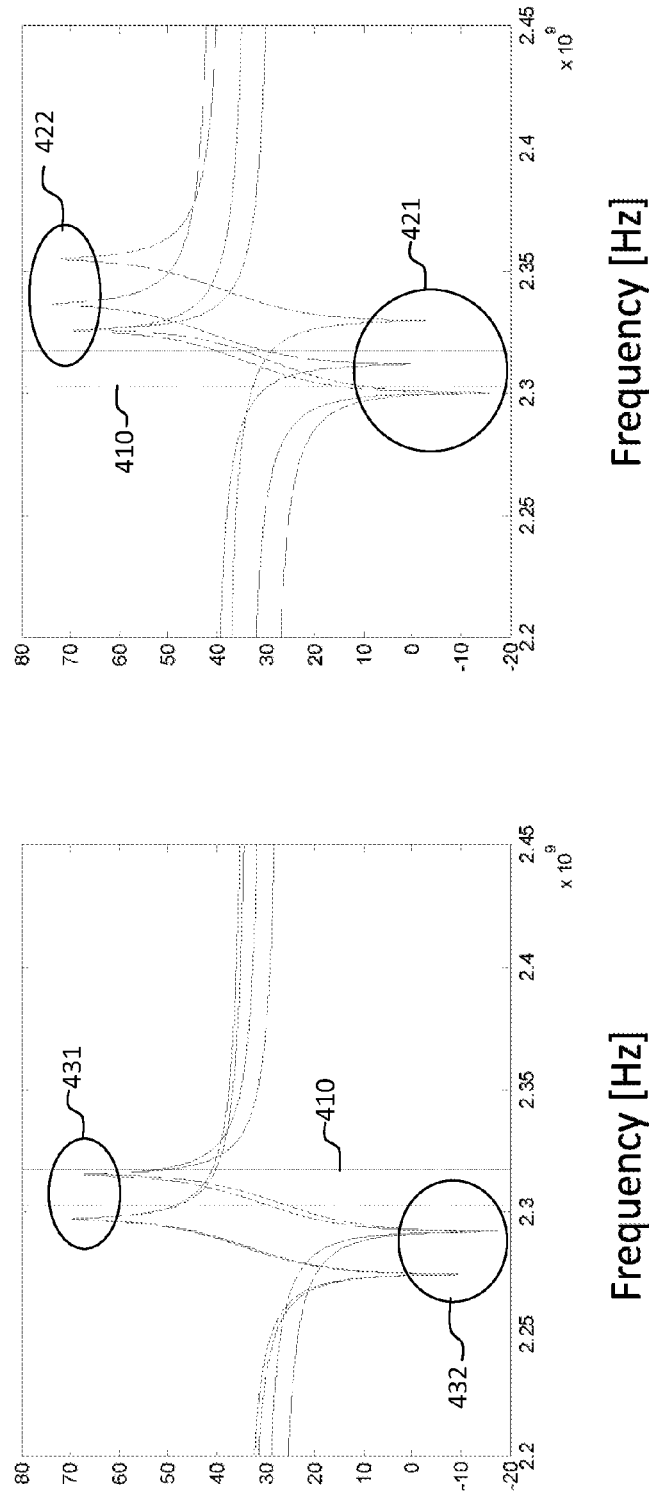
FIG. 4A is a signal diagram showing impedances of series and shunt resonators as a function of signal frequency in a filter device, according to a representative embodiment.
Figure 4B:
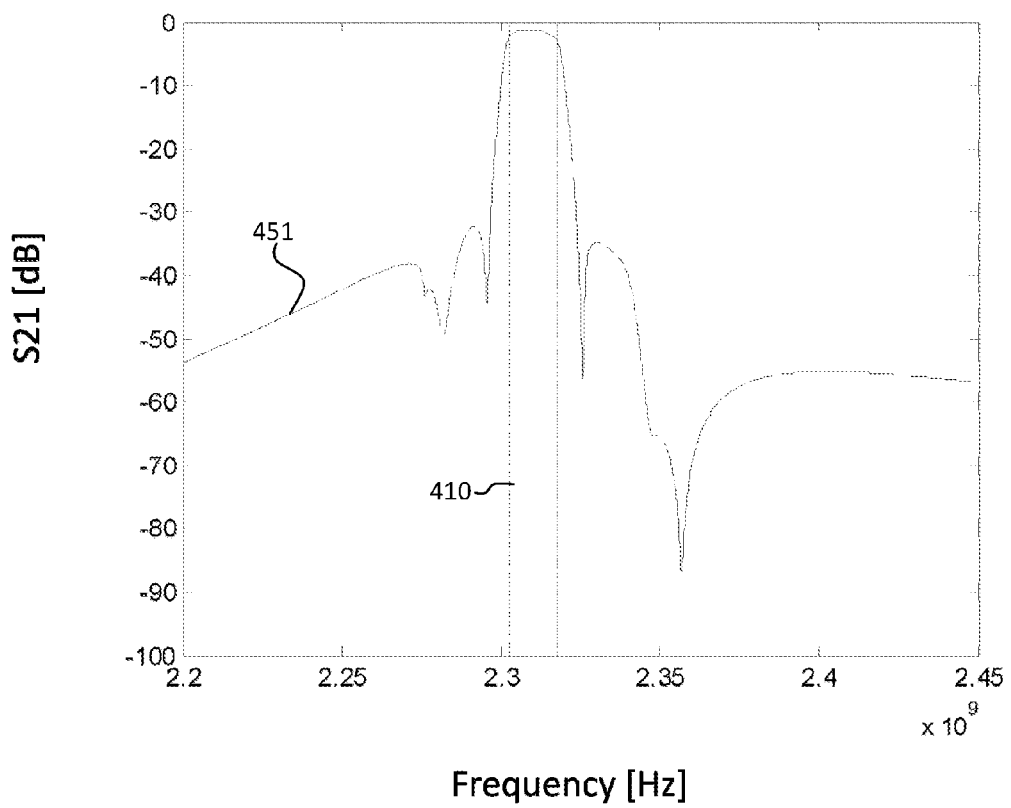
FIG. 4B is a signal diagram showing S-parameter S21 response as a function of signal frequency in a filter device, according to a representative embodiment.

FIGS. 4A and 4B are signal diagrams showing parameters of electromechanical coupling resonators in a filter device, according to a representative embodiment. In particular, FIG. 4A shows impedance Z of the series and shunt resonators (e.g., first through fourth series resonators 121-124 and first through fourth shunt resonators 131-134) as a function of signal frequency, and FIG. 4B shows the S-parameter S21 response of the filter device (e.g., filter device 100) as a function of signal frequency. As shown in FIGS. 4A and 4B, the filter device has a representative pass-band 310 of about 15 MHz (from about 2302.5 MHz to about 2317.5 MHz), for purposes of illustration. Significantly, though, the electromechanical coupling coefficient $Kt^2$ of each of the first through fourth series resonators 121-124 and the first through fourth shunt resonators 131-134 nearly doubles. For example, in the depicted embodiment, the electromechanical coupling coefficient $Kt^2$ increases from about 1.5 percent (of the conventional filter device indicated by FIGS. 3A and 3B) to about 3.0 percent for the same size pass-bands 310 and 410. Alternatively, if the electromechanical coupling coefficient $Kt^2$ is kept constant, the pass-band 410 of the filter device 100 decreases by about half from the pass-band 210, for example.

Referring to FIG. 4A, the first through fourth series resonators 121-124 are configured such that only one of the corresponding series resonance frequencies Fs (indicated by oval 421) is inside the pass-band 410, and the other series resonance frequencies Fs and all of the parallel resonance frequencies Fp (indicated by oval 422) are outside the pass-band 410. The series resonance frequencies Fs that are outside the pass-band 410 contribute to effectively cutting off the high frequency side of the pass-band 410 (in the upper stop-band). Similarly, the first through fourth shunt resonators 131-134 are configured such that only two of the corresponding parallel resonance frequencies Fp (indicated by oval 431) are inside the pass-band 410, and the other parallel resonance frequencies Fp and all of the series resonance frequencies Fs (indicated by oval 432) are outside the pass-band 410. The parallel resonance frequencies Fs Fp that are outside the pass-band 410 contribute to effectively cutting off the low frequency side of the pass-band 410 (in the lower stop-band). Of course, the number of series resonance frequencies Fs of the first through fourth series resonators 121-124 and the number of parallel resonance frequencies Fp of the first through fourth shunt resonators 131-134 located within the pass-band 410 may vary, to provide unique benefits for any particular situation or to meet application specific design requirements of various implementations, without departing from the scope of the present teachings.

Referring to FIG. 4B, trace 451 shows the S-parameter S21 of the filter device. Trace 451 indicates a less steep roll-off than the trace 351 shown in FIG. 3B, meaning that the filter device according to the representative embodiment is less efficient and may be more susceptible to out-of-band interference. However, this is considered a minor trade-off considering the significant increase electromechanical coupling coefficient $Kt^2$ over the conventional filter device (from about 1.5 percent to about 3.0 percent) for the same size pass-bands 310 and 410.

In order to design an acoustic filter device according to representative embodiments, parameters of the acoustic filter device are varied incrementally to achieve the target result. For example, in order to reduce the filter bandwidth (FBW) without affecting the electromechanical coupling coefficient $Kt^2$, the electromechanical coupling coefficient $Kt^2$ may be maintained while the FBW is narrowed incrementally in a series of steps. In each step of the design process, the resonator bandwidths (RBWs) of the electromechanical coupling resonators (that is, the series and shunt resonators) of the acoustic filter device remain the same.

For example, in order to achieve a narrower target filter bandwidth (TFBW), while maintaining the electromechanical coupling coefficient $Kt^2$, the series and shunt resonators included in the acoustic filter device are selected to have corresponding RBWs that are substantially the same as the initial FBW of the acoustic filter. Then, the electromechanical coupling coefficient $Kt^2$ remains fixed, while the impedance Zs and the series resonance frequency Fs of each of the acoustic resonators are free parameters that are allowed to vary, if necessary, for optimization on a step-by-step basis. Generally, in conventional filter design approaches, the resonator bandwidth of an acoustic resonator is nearly equal to the difference between the parallel resonance frequency Fp and the series resonance frequency Fs (i.e., RBW=Fp−Fs). A typical ratio between the resonator bandwidth of an acoustic resonator and the filter bandwidth of the acoustic filter device is between about 0.95 and about 1.05 (i.e., 0.95<RBW/FBW<1.05), for example. Accordingly, the resonator bandwidths of the acoustic resonators in the acoustic filter device limit the available range of the FBW. Also, various factors constrain the range of the RBW, such as properties of the piezoelectric material in the acoustic resonator, manufacturing process limitations, and performance degradation of the acoustic resonator. The Q-factor of the acoustic resonator generally decreases when the electromechanical coupling coefficient $Kt^2$ becomes smaller, resulting in degraded performance of the acoustic filter device.

FIGS. 5A to 5K are signal diagrams showing S-parameter S21 responses as functions of signal frequency in a step-by-step design process for narrowing a pass-band of a filter device, while maintaining the electromechanical coupling coefficient $Kt^2$, according to a representative embodiment.

In the present example, the TFBW of the acoustic filter device is ultimately narrower than the given RBW of each of the acoustic resonators forming the acoustic filter. While the filter device reduces its FBW, the RBW remain constant, and the series resonance frequency Fs of one or more series resonators move to a lower frequency, causing the corresponding parallel resonance frequency Fp also to move to a lower frequency, thus cutting off a portion of the high frequency side of the pass-band. Similarly, the series resonance frequency Fs of one or more shunt resonators move to a higher frequency, causing the corresponding parallel resonance frequency Fp also to move to a higher frequency, thus cutting off a portion of the low frequency side of the pass-band. The series resonance frequency Fs and the impedance Zs of one or more of the remaining series and shunt resonators may also be adjusted to compensate for the changes and to maintain good performance of the acoustic filter, as would be apparent to one of ordinary skill in the art.

Figure 5A:
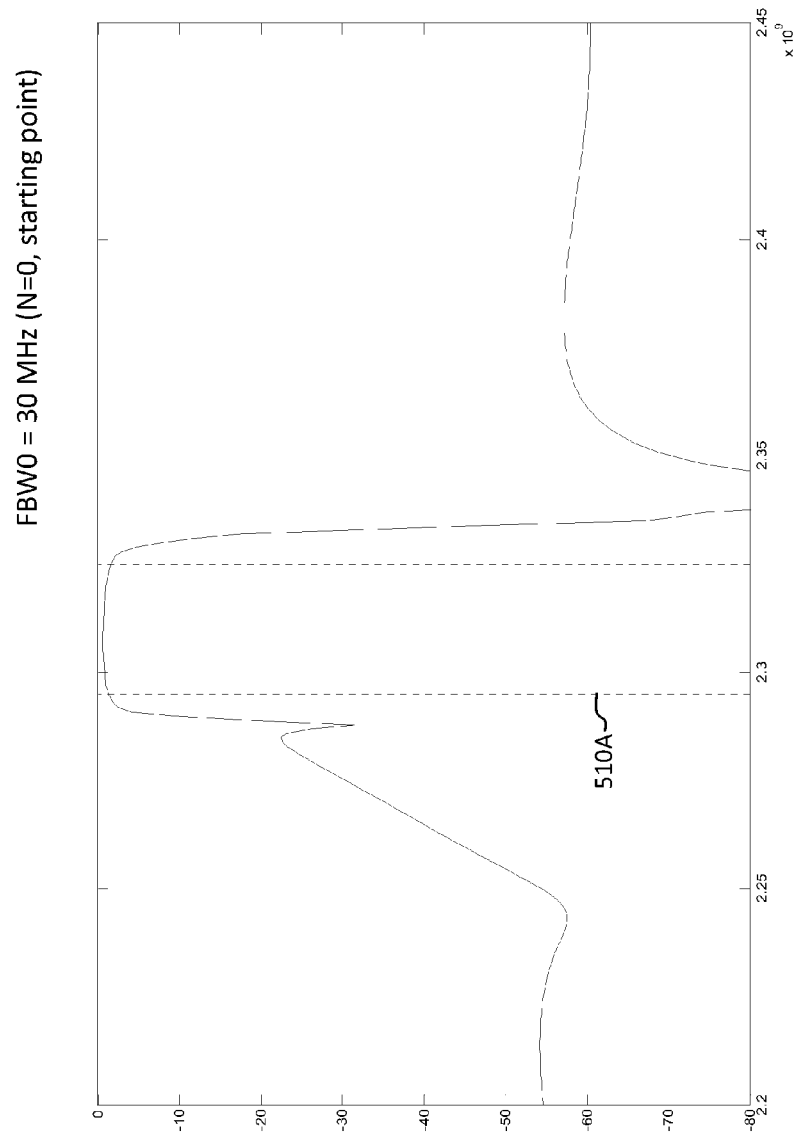

For purposes of illustration, it may be assumed that the TFBW of an acoustic filter device is 15 MHz, as shown in FIG. 5K (final step), and the given RBW of each of the acoustic resonators in the acoustic filter device is 30 MHz. The 30 MHz RBW is an appropriate value for a conventional acoustic filter device for a 30 MHz FBW, as shown in FIG. 5A (initial step). Thus, an acoustic filter device having a 30 MHz FBW 510A is initially designed as shown in FIG. 5A, e.g., in accordance with a conventional design approach, the performance of which would be apparent to one of ordinary skill in the art. According to the conventional design approach, the parallel resonance frequency Fp of each of the shunt resonators and the series resonance frequency Fs of each of the series resonators frequency are within the pass-band of the acoustic filter device, as shown in FIG. 2A, for example.

The initial 30 MHz FBW 510A is then incrementally adjusted downward to the TFBW of 15 MHz (FBW 510K or tenth adjusted filter bandwidth 510K) in a series of steps, according to Equation (2), where N is the total number of incremental steps in the adjustment process and n is the number of the current incremental step:

$$FBW_n = FBW - (FBW - TFBW) * n/N \quad (2)$$

That is, the acoustic filter device is redesigned N times to respectively provide corresponding adjusted FBWs as determined by Equation (2) for each value of n. The Nth redesign results in an acoustic filter device having the TBW. The 30 MHz RBW of each of the acoustic resonators remains substantially the same throughout the redesign steps.

Figure 5B:
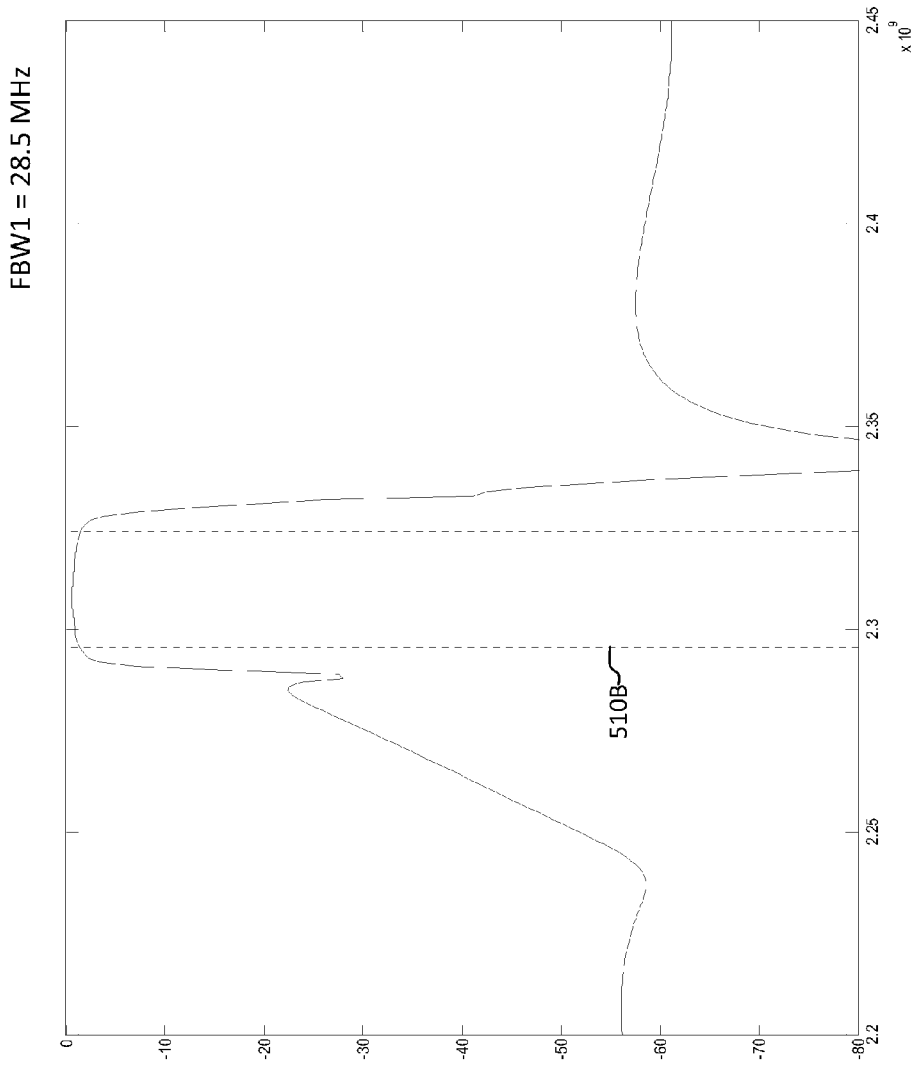

Therefore, continuing with the present example as shown in FIG. 5B, the FBW of the acoustic filter device is set to 30 MHz−(30 MHz−15 MHz)*1/10 for n=1, which results in a first adjusted filter bandwidth (FBW$_1$) 510B of 28.5 MHz. The acoustic filter device initially designed for the filter bandwidth of 30 MHz is then redesigned, e.g., to optimize available design parameters, for the first adjusted filter bandwidth 510B of 28.5 MHz, using the initial design as the starting point of the optimization process. During the optimization process, the resonance frequency corresponding to at least one acoustic resonator is allowed to vary a greater range than the other acoustic resonators. Accordingly, the parallel resonance frequency Fp (when the at least one acoustic resonator is shunt resonator) or the series resonance frequency Fs (when the at least one acoustic resonator is a series resonator) is moved outward from the band center of the pass-band, thereby cutting the pass-band in order to reduce the frequency bandwidth of the acoustic filter device (to 28.5 MHz). For example, the range the resonance frequency may be allowed to vary is at least about ±2.5 MHz.

Figure 5C:
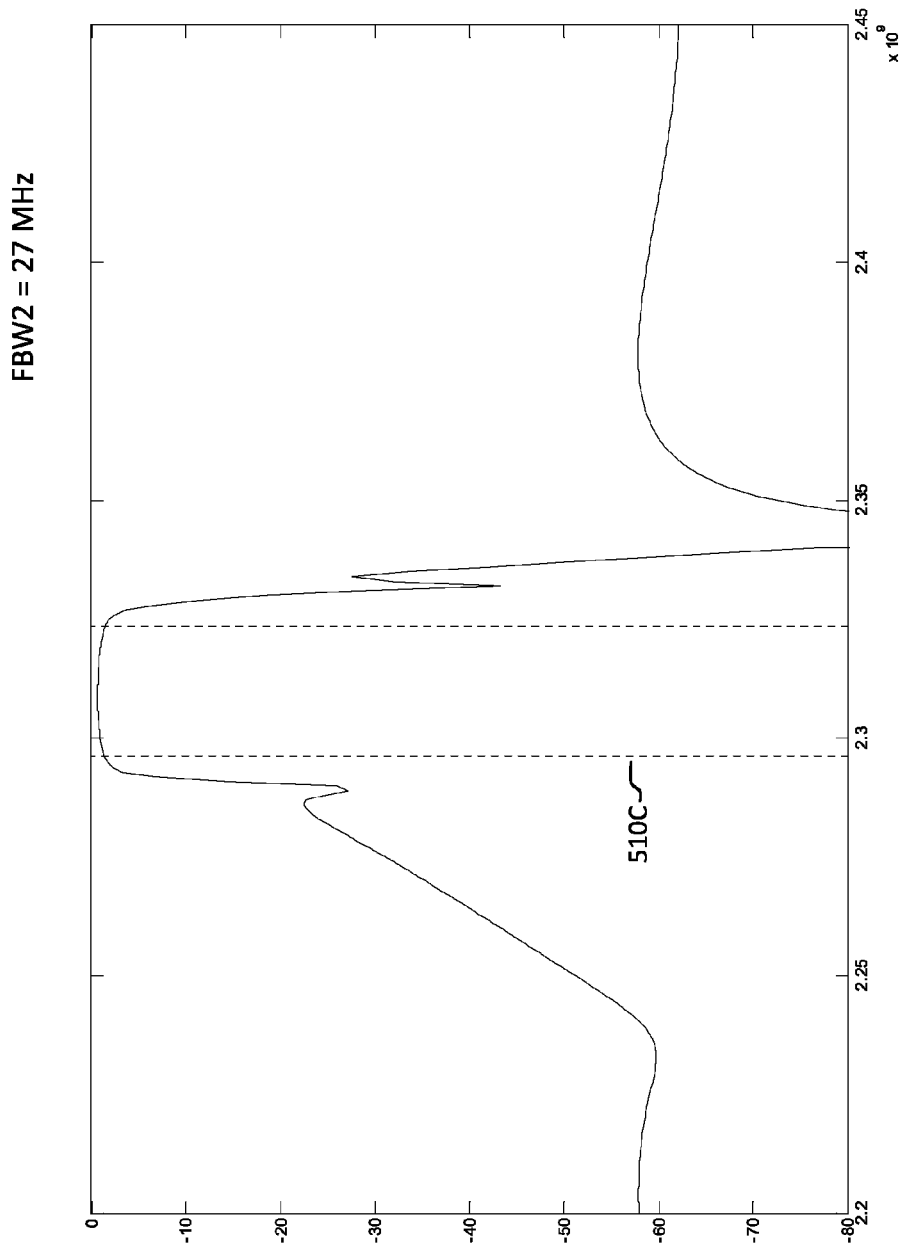

Next, referring to FIG. 5C for n=2, the second adjusted filter bandwidth (FBW$_2$) 510C of the acoustic filter is set to 30 MHz−(30 MHz−15 MHz)*2/10, which is 27.0 MHz. The acoustic filter device designed for the first adjusted filter bandwidth 510B of 28.5 MHz is then redesigned, e.g., to optimize available design parameters, for the second adjusted filter bandwidth 510C of 27.0 MHz, using the first adjusted filter bandwidth of 28.5 MHz as the starting point of the optimization process. If the resonant frequency of the one or more acoustic resonators start to move further outward from the band center of the pass-band (and/or outside of the pass-band), allow it to do so. The range the resonance frequency is allowed to vary may need to be expanded. In addition, the resonant frequencies of more acoustic resonators may need to be allowed to move outward from the band center to maintain good filter performance. Generally, as the filter bandwidth narrows incrementally, the resonance frequencies of more acoustic resonators need to move outward (and/or further outward) from the band center of the pass-band.

Figure 5D:
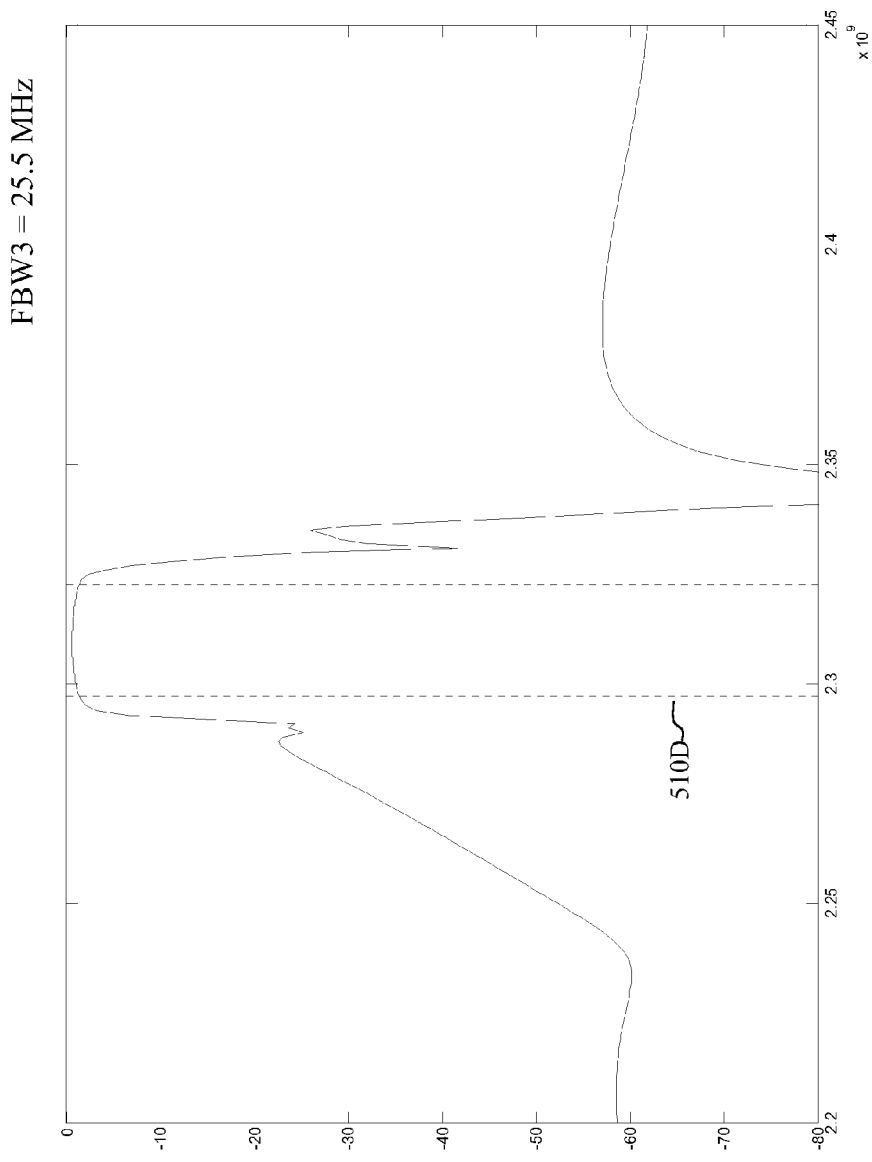
Figure 5E:
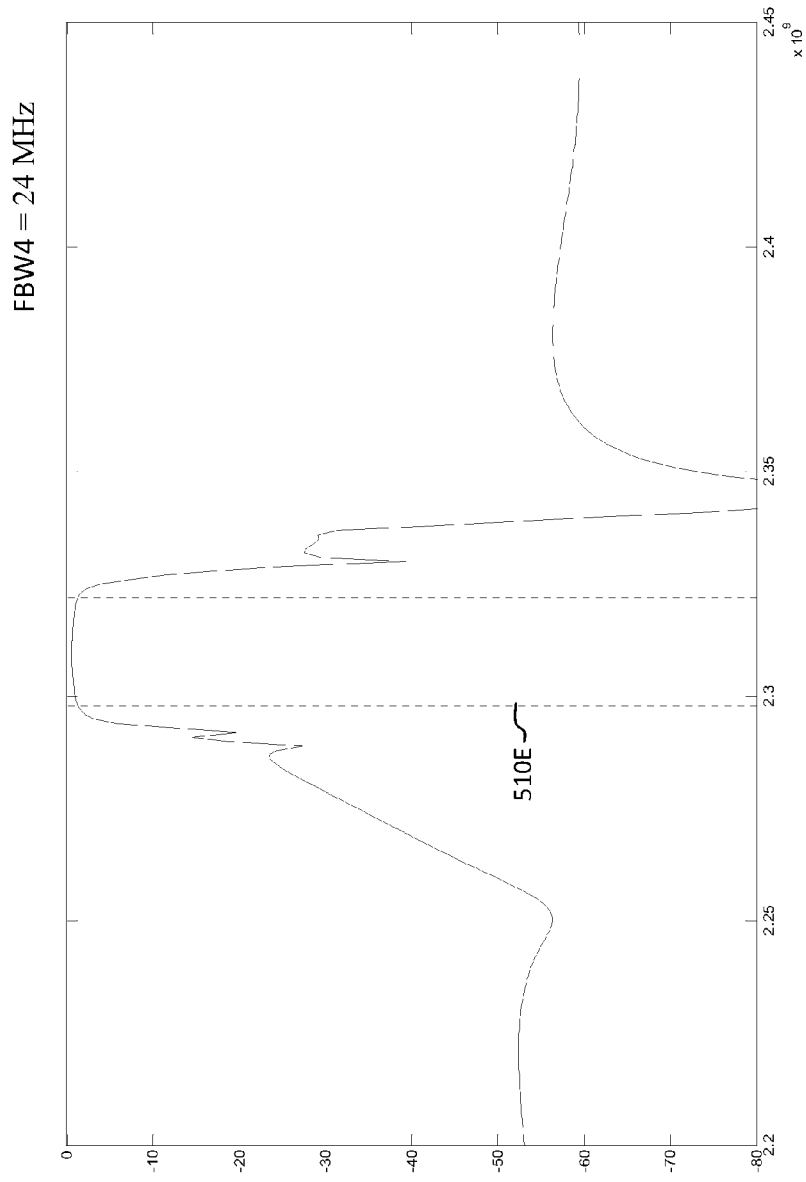
Figure 5F:
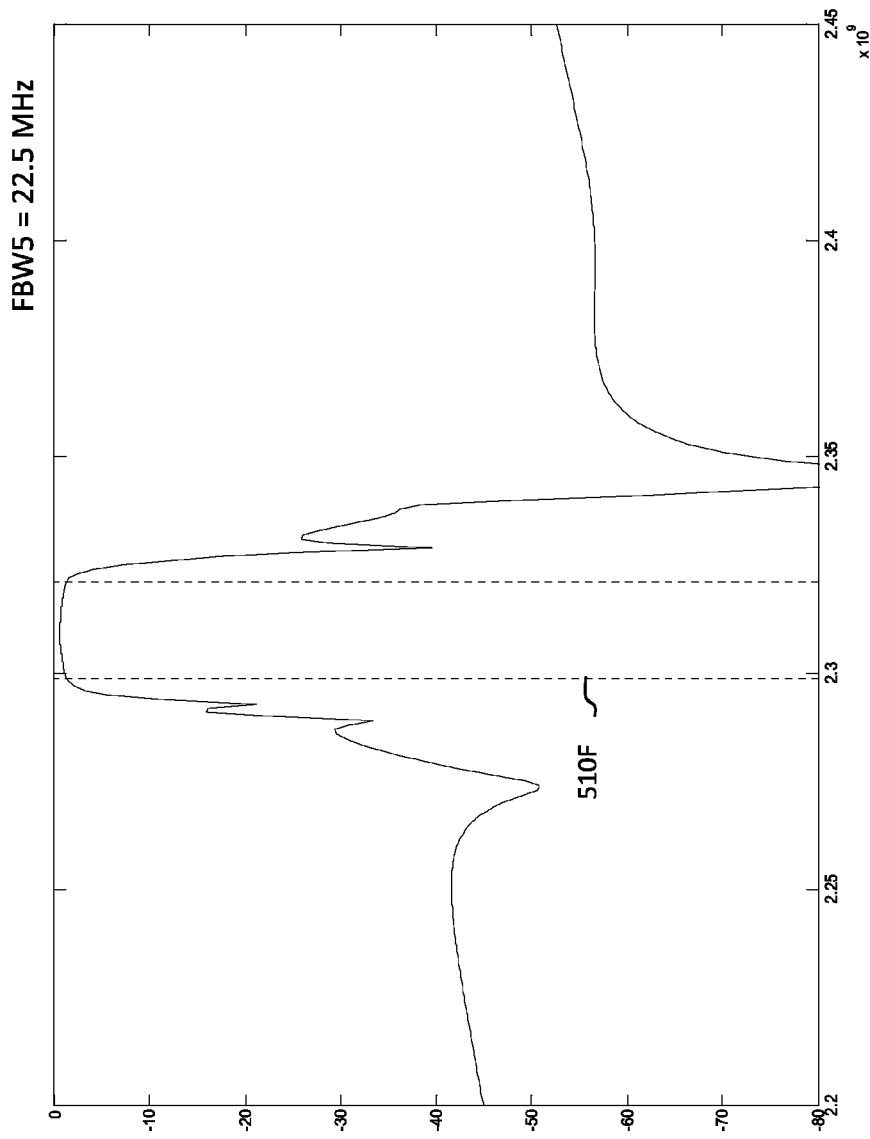
Figure 5G:
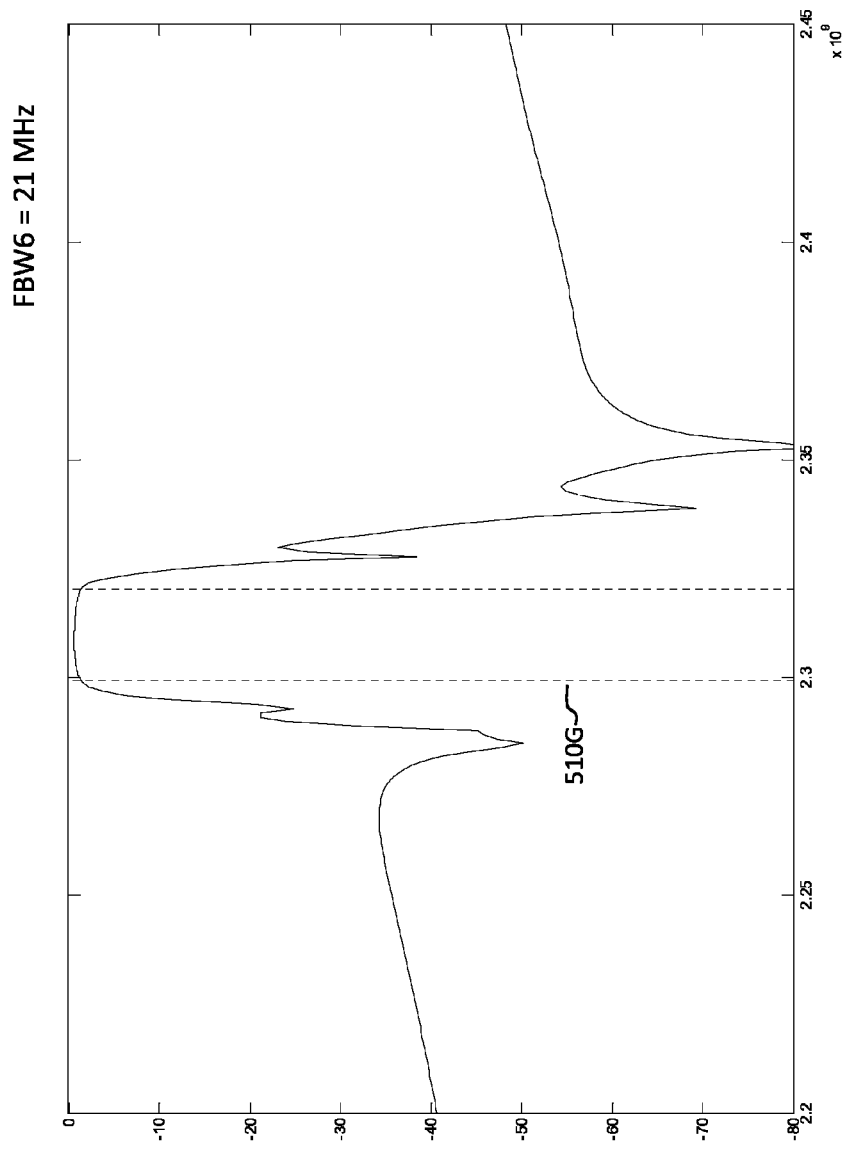
Figure 5H:
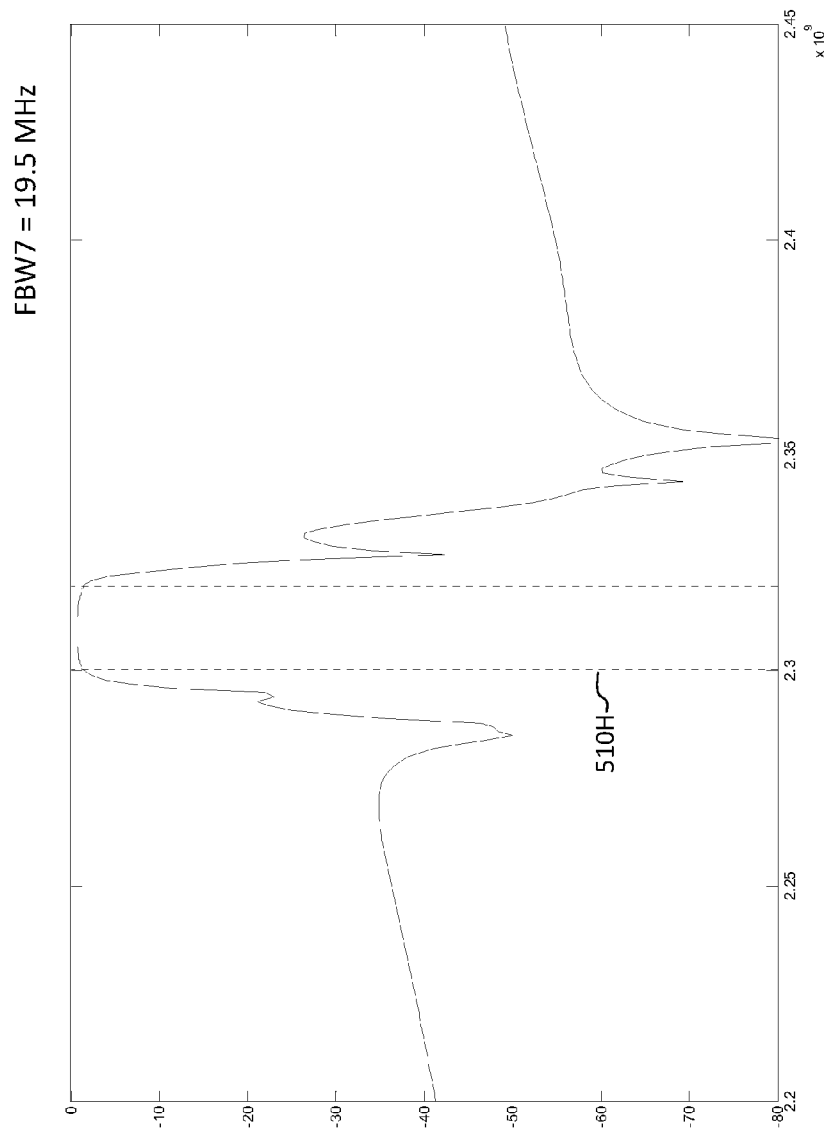
Figure 5I:
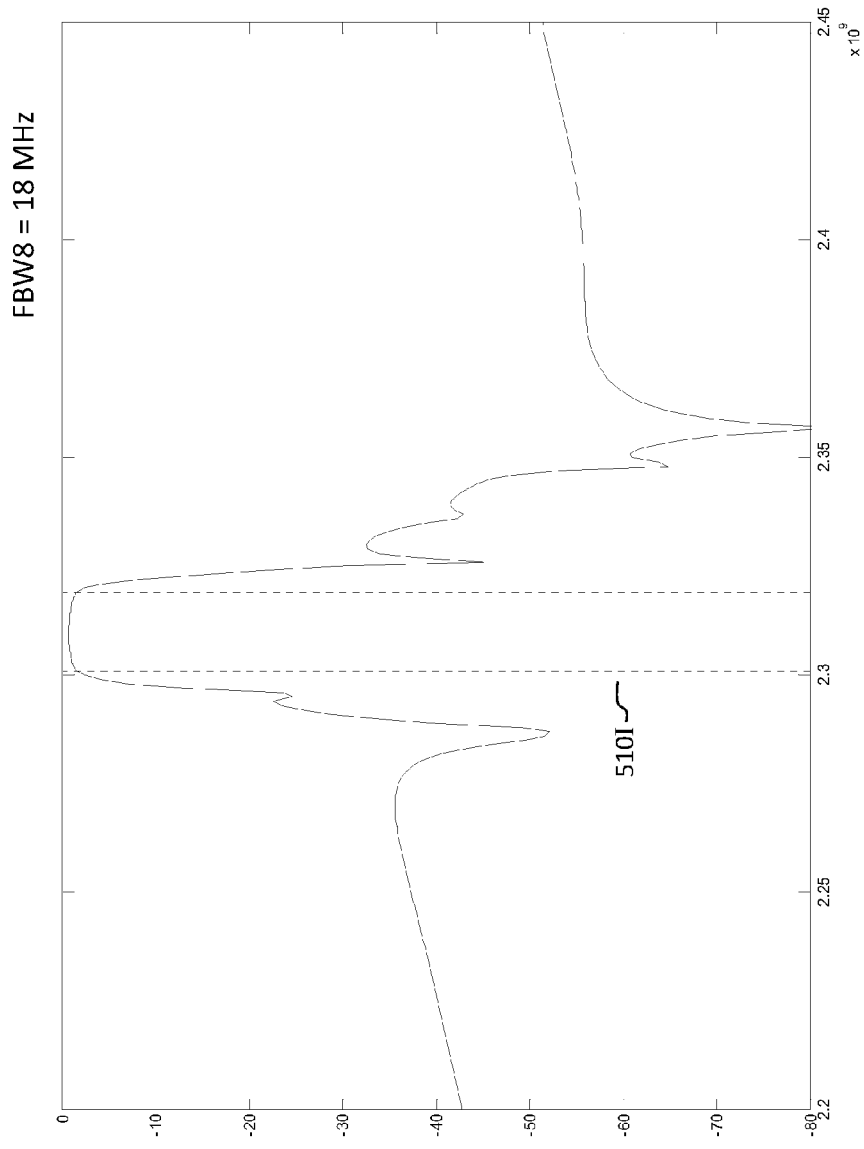
Figure 5J:
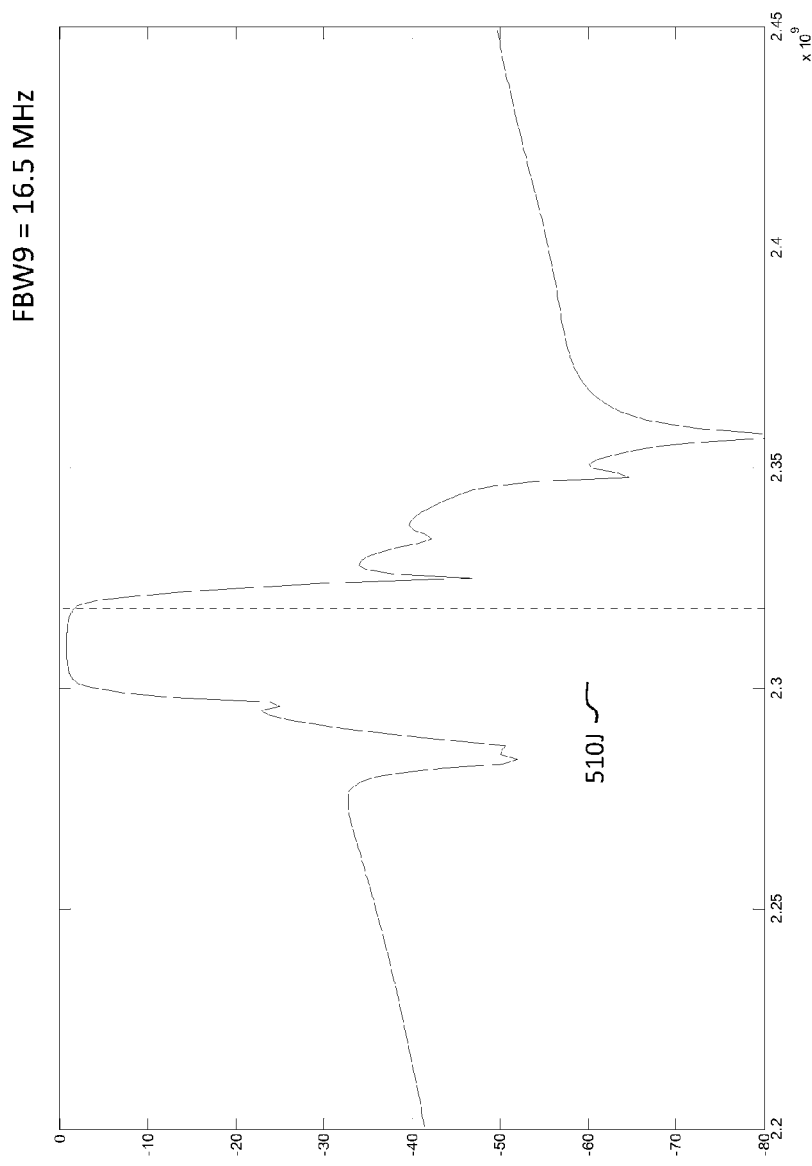

Next, referring to FIG. 5D for n=3, the third adjusted filter bandwidth (FBW$_3$) 510D of the acoustic filter is set to 30 MHz−(30 MHz−15 MHz)*3/10, which is 25.5 MHz. The acoustic filter device designed for the second adjusted filter bandwidth 510C of 27.0 MHz is then redesigned, e.g., to optimize available design parameters, for the third adjusted filter bandwidth 510D of 25.5 MHz, using the second adjusted filter bandwidth of 27.0 MHz as the starting point of the optimization process. Again, if the resonant frequency of any of the acoustic resonators start to move further outward from the band center of the pass-band (and/or outside of the pass-band), allow it to do so. The range the resonance frequency is allowed to vary may need to be expanded. In addition, the resonant frequencies of more acoustic resonators may need to be allowed to move outward from the band center to maintain good filter performance.

This process is repeated seven more times as shown in FIGS. 5E through 5K (for a total of ten), in which fourth adjusted filter bandwidth 510E, fifth adjusted filter bandwidth 510F, sixth adjusted filter bandwidth 510G, seventh adjusted filter bandwidth 510H, eighth adjusted filter bandwidth 510I, ninth adjusted bandwidth filter 510J, and tenth adjusted filter bandwidth 510K are incrementally obtained, respectively using the immediately preceding adjusted filter bandwidths as the starting points for the corresponding optimization processes, as described above. Ultimately, the tenth adjusted filter bandwidth (FBW$_{10}$) 510K of the acoustic filter is obtained, which is the same as the TFBW of 15 MHz. Of course, the number of steps (N) of the overall design process may be greater or less than ten to provide unique benefits for any particular situation or to meet application specific design requirements of various implementations, without departing from the scope of the present teachings. The resulting acoustic filter device (e.g., acoustic filter device 100) therefore has a relatively narrow pass-band, and an electromechanical coupling coefficient $Kt^2$ that has been maintained and is therefore relatively high compared to the narrowness of the pass-band.

By dividing the design process into multiple steps, as described above, the chances that the optimization process performed in each step looses the solution will be reduced significantly. Also, maintaining the resonance frequency of each of the resonators during the design process achieves better performance of the filter device. For example, if the 15 MHz target filter bandwidth were designed in one step, starting from the 30 MHz filter bandwidth design, on the condition that all acoustic resonators were allowed to change resonance frequency values over a wide range, rather than the well-controlled ten-step process described the above, it would be very likely that optimization would never converge and a solution would not be obtained.

In addition, according to various embodiments, a filter device may be integrated onto a single chip. That is, the filter device includes multiple series resonators (e.g., first through fourth series resonators 121-124) on a chip connected in series between an input terminal and an output terminal, and multiple shunt resonators (e.g., first through fourth shunt resonators 131-134) on the same chip respectively connected between at least one of the series resistors and a ground voltage. As discussed above, at least one of the series resonators contributes to band stop filtering, and at least another one of the series resonators contributes to band pass filtering of the filter device. Likewise, at least one of the shunt resonators contributes to band stop filtering, and at least another one of the shunt resonators contributes to band pass filtering of the filter device.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A filter device for filtering signals via a pass-band, the filter device comprising:
a plurality of series resonators connected in series between an input terminal and an output terminal, each of the series resonators having a corresponding parallel resonance frequency Fp and series resonance frequency Fs; and
a plurality of shunt resonators respectively connected between at least one of the series resonators and a ground voltage, each of the shunt resonators having a corresponding parallel resonance frequency Fp and series resonance frequency Fs,
wherein at least one series resonator of the plurality of series resonators has a corresponding series resonance frequency Fs outside the pass-band of the filter device, and at least one other series resonator of the plurality of series resonators has a corresponding series resonance frequency Fs inside the pass-band, and/or
wherein at least one shunt resonator of the plurality of shunt resonators has a corresponding parallel resonance frequency Fp outside the pass-band of the filter device, and at least one other shunt resonator of the plurality of shunt resonators has a corresponding parallel resonance frequency Fp inside the pass-band.

2. The filter device of claim 1, wherein the at least one series resonator having the corresponding series resonance frequency Fs outside the pass-band contributes to band stop filtering, and the at least one other series resonator having the corresponding series resonance frequency Fs inside the pass-band contributes to band pass filtering.

3. The filter device of claim 2, wherein the at least one shunt resonator having the corresponding parallel resonance frequency Fp outside the pass-band contributes to band stop filtering, and the at least one other shunt resonator having the corresponding parallel resonance frequency Fp inside the pass-band contributes to band pass filtering.

4. The filter device of claim 1, wherein the pass-band is narrow, and an electromechanical coupling coefficient $Kt^2$ is maintained relatively high compared to the narrowness of the pass-band.

5. The filter device of claim 1, wherein the pass-band has a narrow bandwidth determined approximately by the product of 0.4 and the difference between the parallel resonance frequency Fp and the series resonance frequency Fs of the resonators of the filter device, where resolution bandwidths (RBWs) of the series and shunt resonators are the same.

6. The filter device of claim 1, wherein the parallel resonance frequencies Fp of the plurality of series resonators create transmission-zeros on a high frequency side of the pass-band, and the series resonance frequencies Fs of the plurality of shunt resonators create transmission-zeros on a low frequency side of the pass-band.

7. The filter device of claim 1, wherein the input terminal is connected to an antenna and the output terminal is connected to a receiver, such that the filter device comprises a receive filter.

8. The filter device of claim 1, wherein the input terminal is connected to a transmitter and the output terminal is connected to an antenna, such that the filter device comprises a transmit filter.

9. The filter device of claim 1, wherein each of the series resonators and each of the shunt resonators comprises a thin film bulk acoustic resonator (FBAR).

10. The filter device of claim 1, wherein each of the series resonators and each of the shunt resonators comprises a solidly mounted resonator (SMR).

11. A filter device for filtering signals via a pass-band, the filter device comprising:
a plurality of series resonators on a chip connected in series between an input terminal and an output terminal, wherein at least one series resonator contributes to band stop filtering, and at least one series resonator contributes to band pass filtering of the filter device; and
a plurality of shunt resonators on the same chip respectively connected between at least one of the series resistors and a ground voltage, wherein at least one shunt resonator contributes to band stop filtering, and at least one shunt resonator contributes to band pass filtering of the filter device.

12. The filter device of claim 11, wherein the at least one series resonator contributing to the band stop filtering has a corresponding series resonance frequency Fs outside the pass-band, and the at least one series resonator contributing to the band pass filtering has a corresponding series resonance frequency Fs inside the pass-band.

13. The filter device of claim 11, wherein the at least one shunt resonator contributing to the band stop filtering has a corresponding parallel resonance frequency Fp outside the pass-band, and the at least one shunt resonator contributing to the band pass filtering has a corresponding parallel resonance frequency Fp inside the pass-band.

14. A filter device for filtering signals, the filter device comprising:
a plurality of series resonators connected in series between an input terminal and an output terminal, the series resonators having corresponding different series resonance frequencies Fs, wherein the series resonators are arranged so that at least one of the different series resonance frequencies Fs occurs outside a pass-band of the filter device; and
a plurality of shunt resonators respectively connected between at least one of the series resistors and a ground voltage, the shunt resonators having corresponding different parallel resonance frequencies Fp, wherein the shunt resonators are arranged so that at least one of the different parallel resonance frequencies Fp occurs outside the pass-band of the filter device.

15. The filter device of claim 14, the series resonators are arranged so that at least another one of the different series resonance frequencies Fs occurs inside the pass-band of the filter device.

16. The filter device of claim 14, the shunt resonators are arranged so that at least another one of the different parallel resonance frequencies Fp occurs inside the pass-band of the filter device.

17. The filter device of claim 14, wherein each of the series resonators and each of the shunt resonators comprises a bulk acoustic wave (BAW) resonator.

18. The filter device of claim 14, wherein each of the series resonators and each of the shunt resonators comprises a surface acoustic wave (SAW) resonator.

\* \* \* \* \*